(12) United States Patent
Boroson et al.

(10) Patent No.: US 6,740,145 B2
(45) Date of Patent: May 25, 2004

(54) DESICCANTS AND DESICCANT PACKAGES FOR HIGHLY MOISTURE-SENSITIVE ELECTRONIC DEVICES

(75) Inventors: Michael L. Boroson, Rochester, NY (US); Jeffrey P. Serbicki, Holley, NY (US); Peter G. Bessey, Clifton Springs, NY (US); Glen C. Irvin, Rochester, NY (US); Lawrence A. Rowley, Rochester, NY (US); Cheryl J. Kaminsky, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 45 days.

(21) Appl. No.: 09/924,778

(22) Filed: Aug. 8, 2001

(65) Prior Publication Data

US 2003/0037677 A1 Feb. 27, 2003

(51) Int. Cl.[7] ............................................... B01D 53/04
(52) U.S. Cl. .................... 96/108; 96/147; 55/385.6; 252/194; 206/204; 502/400
(58) Field of Search .................... 96/108, 147, 148, 96/154, 118; 502/400; 55/385.6; 206/204; 252/194; 34/80, 474, DIG. 1

(56) References Cited

U.S. PATENT DOCUMENTS

| | | | |
|---|---|---|---|
| 3,607,777 A | * 9/1971 | Winyall et al. ............. 423/338 |
| 4,008,170 A | * 2/1977 | Allan ......................... 252/194 |
| 4,013,566 A | 3/1977 | Taylor |
| 4,036,360 A | 7/1977 | Deffeyes |
| 4,081,397 A | 3/1978 | Booe |
| 4,992,190 A | * 2/1991 | Shtarkman ................ 252/62.52 |
| 5,047,687 A | 9/1991 | VanSlyke |
| 5,304,419 A | 4/1994 | Shores |
| 5,384,357 A | * 1/1995 | Levinson et al. ........... 524/770 |
| 5,393,457 A | * 2/1995 | Miksic et al. ................ 252/194 |
| 5,401,536 A | 3/1995 | Shores |
| 5,445,876 A | * 8/1995 | Kyricos ....................... 428/283 |
| 5,591,379 A | 1/1997 | Shores |
| 5,685,897 A | * 11/1997 | Belding et al. ................ 96/154 |
| 6,143,057 A | * 11/2000 | Bulow et al. .................. 95/96 |
| 6,226,890 B1 | 5/2001 | Boroson et al. |
| 6,470,594 B1 | * 10/2002 | Boroson et al. .............. 34/335 |

FOREIGN PATENT DOCUMENTS

| | | |
|---|---|---|
| EP | 0 776 147 | 5/1997 |
| JP | 3-035706 B1 * | 4/2000 |
| JP | 2002-047007 A * | 2/2002 |

* cited by examiner

Primary Examiner—Frank M. Lawrence
(74) Attorney, Agent, or Firm—Raymond L. Owens (57) ABSTRACT

An effective desiccant for use in a package which has a material including at least in part solid particles of one or more materials, at least one of such materials having an average particle size range 0.001 to 0.1 micrometers to provide a high rate of water absorption and to provide an equilibrium minimum humidity level lower than a humidity level to which a highly moisture sensitive electronic device is sensitive within a sealed enclosure.

32 Claims, 5 Drawing Sheets

DESICCANTS AND DESICCANT PACKAGES FOR HIGHLY MOISTURE-SENSITIVE ELECTRONIC DEVICES

FIELD OF THE INVENTION

The present invention relates to control of moisture inside a packaged electronic device and relates particularly to an improved desiccant and desiccant package which desiccates highly moisture-sensitive electronic devices to prevent premature device failure or premature degradation of device performance.

BACKGROUND OF THE INVENTION

Various microelectronic devices require humidity levels in a range of about 2500 to below 5000 parts per million (ppm) to prevent premature degradation of device performance within a specified operating and/or storage life of the device. Control of the environment to this range of humidity levels within a packaged device is typically achieved by encapsulating the device or by sealing the device and a desiccant package within a cover. Desiccant packages include a container for receiving solid water absorbing particles (a desiccant) or providing such particles into a binder. Examples of solid water absorbing particles include molecular sieve materials, silica gel materials, and materials commonly referred to as Drierite materials which are used to maintain the humidity level within the above range.

Particular microelectronic devices, for example, organic light-emitting devices (OLED) or panels, polymer light-emitting devices, charge-coupled device (CCD) sensors, and micro-electro-mechanical sensors (MEMS) require humidity control to levels below about 1000 ppm and some require humidity control below even 100 ppm. Such low levels are not achievable with desiccants of silica gel materials and of Drierite materials. Molecular sieve materials can achieve humidity levels below 1000 ppm within an enclosure if dried at a relatively high temperature. However, molecular sieve materials have a relatively low moisture capacity at humidity levels at or below 1000 ppm, and the minimum achievable humidity level of molecular sieve materials is a function of temperature within an enclosure: moisture absorbed, for example, at room temperature, can be released into the enclosure or package during temperature cycling to higher temperature, such, as, for example, to a temperature of 100° C. Solid water absorbing particles used within such packaged devices include 0.2 to 200 μm particle size powders of metal oxides, alkaline earth metal oxides, sulfates, metal halides, or perchlorates, i.e. materials having desirably relatively low values of equilibrium minimum humidity and high moisture capacity. However, such materials even when finely divided into powders of 0.2 to 200 μm particle size often chemically absorb moisture relatively slowly compared to the above-mentioned molecular sieve, silica gel, or Drierite materials. Such relatively slow reaction with water vapor leads to a measurable degree of device degradation of performance following the sealing of the desiccant inside a device cover due to, for example, moisture absorbed on the inside of a device, moisture vapor present within the sealed device, and moisture permeating through the seal between the device and the cover from the outside ambient.

Some solid water absorbing particles, particularly molecular sieve materials which entrain moisture by physical absorption within microscopic pores, require a dehydrating step at substantially elevated temperature prior to use within a device enclosure, thus increasing the number of process steps and calling for additional apparatus, such as, for example, a controllable furnace to achieve substantial dehydration.

Selection of solid water absorbing particles and the method of applying selected particles to an inner portion of a device enclosure prior to sealing the device within or by the enclosure is governed by the type of device to be protected from moisture. For example, highly moisture-sensitive organic light-emitting devices or polymer light-emitting devices require the selection of particular solid water absorbing particles and methods of application, since organic materials or organic layers are integral constituents of such devices. The presence of organic materials or layers may, for example, preclude the use of certain solvents or fluids in the application of a solid water absorbing particles dispersed in a fluid to organic-based devices. Furthermore, a thermal treatment, if required, of a desiccant contained within a sealed device enclosure, needs to be tailored to the constraints imposed by thermal properties of the organic constituents or layers of the device. At any rate, release of solvent vapors during a thermal treatment of a desiccant disposed within a sealed device enclosure must be avoided or minimized if solvent vapors can adversely affect organic constituents of organic-based electronic devices. The aforementioned considerations pertaining to organic-based electronic devices may not be as important if the electronic device to be desiccated is strictly an inorganic or metallic device such as, for example, a MEMS device or a CCD sensor without an organic color filter overlay.

For highly moisture sensitive electronic devices, such as organic light-emitting devices or polymer light-emitting devices, VanSlyke, U.S. Pat. No. 5,047,687 teaches the use of a protective layer comprised of a mixture of at least one organic component of the organic electroluminiescent medium and at least one metal having a work function in the range of from 4.0 to 4.5 eV capable of being oxidized in the presence of ambient moisture. The metal in the protective layer is described by VanSlyke as being sufficiently reactive to be oxidized by ambient atmospheric moisture over an extended period of time when incorporated into the organic EL device. In this use the metal is used as solid water absorbing particles for moisture in the protective layer. That neither a coated layer of metal film alone nor successively coated layers of the metal and organic films were effective in preventing the dark spot growth due to ambient moisture was attributed to the slow oxidation of the bulk metal. VanSlyke, therefore, teaches that the oxidation susceptibility of reactive metals that can be oxidized by ambient moisture is enhanced by the higher surface to volume ratios achieved by co-deposition of the metal into a mixed layer of metal and an organic medium. However, VanSlyke does not teach the required metal desiccant particle size for optimal moisture absorption protection nor does he teach the effect of metal particle size on performance in protecting organic EL devices.

Numerous publications describe methods and/or materials for controlling humidity levels within enclosed or encapsulated electronic devices. For example, Kawami et al., European Patent Application EP 0 776 147 A1 disclose an organic EL element enclosed in an airtight container which contains a drying substance comprised of a solid compound for chemically absorbing moisture. The drying substance is spaced from the organic EL element, and the drying substance is consolidated in a predetermined shape by vacuum vapor deposition, sputtering, or spin-coating. Kawami et al. teach the use of the following solid water absorbing particles: alkali metal oxides, alkali earth metal oxides, sulfates, metal halides, and perchlorates. Kawami et al., however, do not teach the effect of particle size of these solid water absorbing particles on their performance.

Shores, U.S. Pat. No. 5,304,419 discloses a moisture and particle getter for enclosures which enclose an electronic device. A portion of an inner surface of the enclosure is coated with a pressure sensitive adhesive containing a solid desiccant with average particle size usually 0.2 to 100 μm and preferably 0.5 to 10 μm.

Shores, U.S. Pat. No. 5,401,536 describes a method of providing a moisture-free enclosure for an electronic device, the enclosure containing a coating or adhesive with desiccant properties. The coating or adhesive comprises a protonated alumina silicate powder with average particle size 0.2 to 100 μm, preferably 1 to 10 μm, dispersed in a polymer.

Shores, U.S. Pat. No. 5,591,379 discloses a moisture gettering composition for hermetic electronic devices. The composition is applied as a coating or adhesive to the interior surface of a device packaging, and the composition comprises a water vapor permeable binder which has dispersed therein a desiccant with average particle size of 0.2–100 μm, preferably 0.3–50 μm, which is preferably a molecular sieve material.

Many of the desiccants disclosed by Shores will not function effectively with highly moisture-sensitive devices at a humidity level lower than 1000 ppm. In addition, Shores does not teach why the particle sizes disclosed are chosen or the effect of particle size on the performance of the desiccants.

Similarly, binders, such as polyethylene disclosed by Shores, that have low moisture absorption rates compared to the absorption rate of the pure selected desiccants would not function effectively to achieve and to maintain a humidity level below 1000 ppm during a projected operational lifetime of a highly moisture-sensitive device.

Deffeyes, U.S. Pat. No. 4,036,360 describes a desiccating material that is useful as a package insert or on the interior walls of packaging boxes for applications requiring only moderate moisture protection, such as film or cameras. The material comprises a desiccant and a resin having a high moisture vapor transmission rate.

The desiccants disclosed by Deffeyes are alumina, bauxite, calcium sulfate, clay, silica gel, and zeolite, but Deffeyes does not describe the particle size of any of the desiccants. None of these desiccants will function effectively with highly moisture-sensitive devices at a humidity level lower than 1000 ppm. In addition the moisture vapor transmission rate requirement for the resin is not adequately defined since there is no reference to the thickness of the measured resins. A material that transmits 40 grams per 24 hrs per 100 in$^2$ at a thickness of 1 mil would be very different than one that transmits 40 grams per 24 hrs per 100 in$^2$ at a thickness of 100 mils. It is therefore not possible to determine if the moisture vapor transmission rates disclosed by Deffeyes are sufficient for highly moisture-sensitive devices.

Taylor, U.S. Pat. No. 4,013,566 describes solid desiccant bodies that are useful as drier materials in refrigerant fluid systems. The solid desiccant body comprises finely divided particles of desiccant material bound in a moisture transmissive aliphatic epoxy polymer matrix.

The desiccants disclosed by Taylor are molecular sieves, activated alumina, and silica gel. Taylor teaches the use of particle sizes 1 to 10 μm, but does not teach the impact of particle size on desiccant performance. None of these desiccants will function effectively with highly moisture-sensitive devices at a humidity level lower than 1000 ppm. In addition the moisture vapor transmission rate requirement for the resin is not adequately defined; stating only that the solid desiccant bodies have rates of adsorption of absorption comparable to the desiccant materials alone. It is therefore not possible to determine if the resins disclosed by Taylor are sufficient for highly moisture-sensitive devices.

Booe, U.S. Pat. No. 4,081,397 describes a composition used for stabilizing the electrical and electronic properties of electrical and electronic devices. The composition comprises alkaline earth oxides in an elastomeric matrix.

The desiccants disclosed by Booe are barium oxide, strontium oxide, and calcium oxide. Booe teaches the use of particle sizes less than 80 mesh (177 μm) to minimize the settling of oxides within the suspension. Booe does not teach the impact of particle size on desiccant performance. These desiccants will function effectively with highly moisture-sensitive devices at humidity levels lower than 1000 ppm; however, Booe claims the elastomeric matrix has the property of retarding the rate of fluid absorption of the alkaline earth particles. In the examples the water absorption rate of the compositions are 5 to 10 times slower than the alkaline earth particles alone. This decrease in absorption rate is disclosed as a desirable feature that improves the handling of the highly reactive alkaline earth oxides. In highly moisture-sensitive devices, however, any decrease in the absorption rate of moisture will increase the likelihood of device degradation, and identification of resins that will increase the absorption rate of moisture would be highly desirable. For highly moisture-sensitive devices, therefore, it is important to determine the minimum allowable water vapor transmission rate of the binders used in combination with effective desiccant materials.

Boroson et al., U.S. Pat. No. 6,226,890 describes a method of desiccating an environment surrounding a moisture-sensitive electronic device sealed within an enclosure, including selecting a desiccant comprised of solid particles having a particle size range 0.1 to 200 micrometers. The desiccant is selected to provide an equilibrium minimum humidity level lower than a humidity level to which the device is sensitive within the sealed enclosure. A binder is chosen that maintains or enhances the moisture absorption rate of the desiccant for blending the selected desiccant therein. The binder may be in liquid phase or dissolved in a liquid. A castable blend is formed including at least the desiccant particles and the binder, the blend having the solid water absorbing particles comprise 10 wt % to 90 wt % of the solid water absorbing particles and the binder.

The blend is cast in a measured amount onto a portion of an interior surface of an enclosure to form a desiccant layer thereover, the enclosure having a sealing flange. The blend is solidified to form a solid desiccant layer, and the electronic device is sealed with the enclosure along the sealing flange. Boroson et al., however, do not teach the effect of particle size of these solid particle desiccants on their performance, nor do they teach any benefit of particles smaller than 0.1 micrometers.

SUMMARY OF THE INVENTION

It is an object of the present invention to provide a desiccant package which includes a desiccant for protecting highly moisture-sensitive electronic devices sealed within an enclosure.

It is another object of the present invention to provide a desiccant for protecting highly moisture-sensitive electronic devices sealed within an enclosure. This object is achieved by a desiccant comprising solid water absorbing particles of one or more materials, at least one of such materials having an average particle size range 0.001 to 0.1 micrometers to provide a high rate of water absorption and to provide an equilibrium minimum humidity level lower than a humidity level to which the device is sensitive within the sealed enclosure.

These objects are achieved by a desiccant package useable for protecting highly moisture-sensitive electronic devices sealed within an enclosure, comprising:

a) a moisture-permeable container which can be positioned in the sealed enclosure;

b) solid water absorbing particles of one or more materials disposed in the moisture-permeable container;

c) said solid water absorbing particles including solid particles of one or more materials, at least one of such materials having an average particle size range 0.001 to 0.1 micrometers to provide a high rate of water absorption and to provide an equilibrium minimum humidity level lower than a humidity level to which the device is sensitive within the sealed enclosure; and d) said moisture-permeable container essentially maintains the moisture absorption rate of the solid water absorbing particles contained therein, the moisture-permeable container acting to separate the solid water absorbing particles from the highly moisture-sensitive device.

The present invention provides the following advantages: a moisture absorption rate that enhances the moisture absorption rate of a solid material capable of providing a low equilibrium minimum humidity within the enclosure, by the reduction of said solid material particle size to an average less than 0.1 micrometers; a moisture absorption rate that essentially maintains or enhances the moisture absorption rate of said less than 0.1 micrometer solid water absorbing particles capable of providing a low equilibrium minimum humidity within the enclosure, by a container or binder in which the solid water absorbing particles are contained; simple, fast, and reliable placement of a desiccant layer on an interior surface of a device enclosure; containment of solid desiccant particles by a container or binder within the device enclosure; thermally curable binders provide for removal of moisture trapped in an uncured desiccant layer by thermal curing of the layer; radiation-curable binders provide for fast curing of a desiccant layer by exposure to radiation; forming a desiccant layer on a separate adhesively bondable support or between a water permeable membrane and a separate adhesively bondable support provides for high speed, roll-to-roll manufacturing of a desiccant layer supply; and providing a desiccant layer having relatively low sensitivity of its desiccation efficacy to temperature cycling at elevated temperature up to 150° C.

DETAILED DESCRIPTION OF THE INVENTION

Throughout the specification and claims, the term "desiccant package" will be understood to mean a desiccant made of solid water absorbing particles and either a package which contains such solid water absorbing particles or the solid water absorbing particles being placed in a binder which can be provided on a surface of an enclosure.

Figure 1:
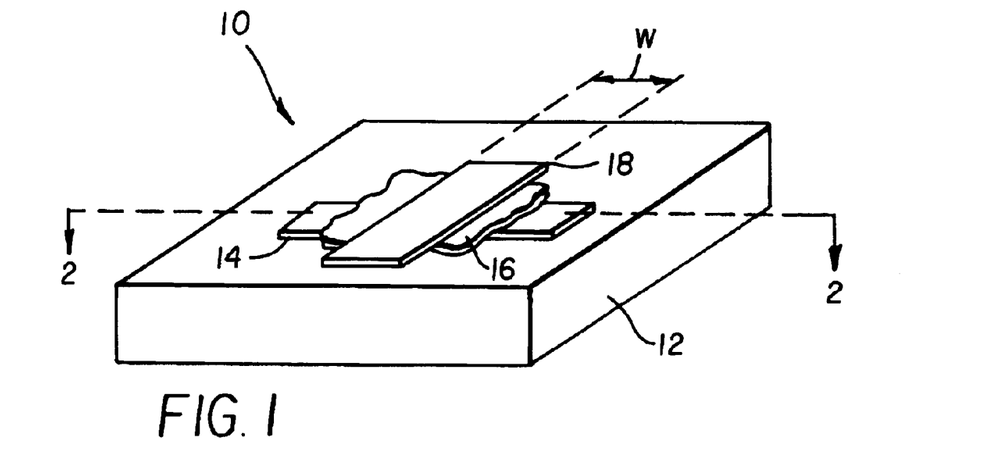
FIG. 1 is a schematic perspective view of an organic light-emitting device (OLED) test structure useful for testing the efficacy of a desiccant package.
Figure 2:
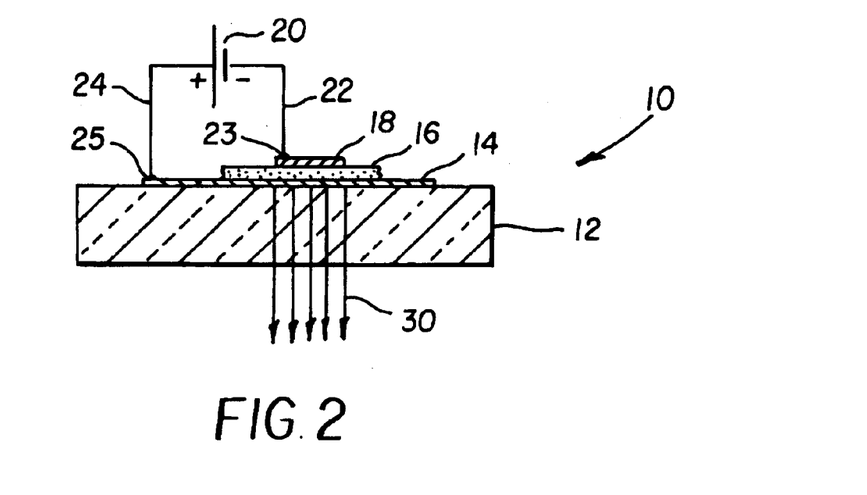
FIG. 2 is a schematic sectional view of the OLED test structure taken along section lines 2—2 of FIG. 1, and depicting emitted light upon application of an electrical potential across the test structure from a drive voltage supply.

Referring to FIG. 1 and FIG. 2, there are shown schematic perspective and sectional views of an organic light-emitting device (OLED) test structure 10 which has been found to be useful for testing the efficacy of a desiccant package, since OLED devices in general are highly moisture-sensitive as evidenced by degradation of a cathode 18 when such a device is operated under ambient conditions of humidity. Details of the construction of the OLED test structure 10 are described under the heading "Experimental Procedures", Section I. Other test structures and test methods can be used, for example, so called "time-to-failure" testing of MEMS devices.

The OLED test structure 10 has a light-transmissive substrate 12 on which is disposed a light-transmissive anode 14. Over the anode 14 and over a portion of the substrate 12 is formed an organic light-emitting layer 16 which comprises at least two layers, namely, an organic hole-transporting layer in contact with the anode 14 and an organic electron-transporting layer in contact with the hole-transporting layer. A cathode 18 is formed in a direction orthogonal to the direction of the anode 14, and having a width dimension w which is a physical width dimension as well as representing an initial electrical width dimension, i.e. an electrical width dimension substantially identical with the physical width dimension w after fabrication and short-duration operation of the OLED test structure 10. The operation of an unprotected OLED test structure 10 is schematically indicated in FIG. 2 wherein a drive voltage supply 20, depicted here as a battery, has its negative terminal connected to the cathode 18 via a lead 22 at a contact 23. The positive terminal of the drive voltage supply 20 is connected to the anode 14 via a lead 24 at a contact 25. The drive voltage supply 20 causes a current to flow through the OLED test structure 10 by injecting electrons into the organic light-emitting layer from the cathode 18, and by injecting holes from the anode 14. The electrons and the holes are transported across the electron-transporting layer (not shown) and the hole-transporting layer (not shown), and these charge carriers recombine at an interface between the electron- and hole-transporting layers, thereby generating emitted light 30 from an area of the OLED test structure which is congruent with the area of intersection between the anode 14 and the cathode 18 during initial operation of the test structure.

Figure 3A:
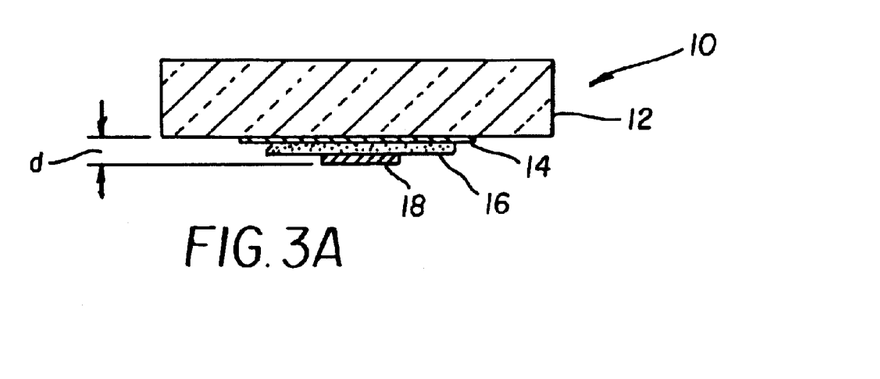
FIG. 3A shows the test structure of FIG. 2 in an inverted position, and defines a total thickness of the layers comprising the test structure.

Turning to FIG. 3A, the OLED test structure 10 is depicted in an inverted position, and a total thickness d of the anode 14, the organic light-emitting layer 16, and the cathode 18 is indicated. The thickness d may be in a range of 200 to 2000 nm.

Figure 3B:
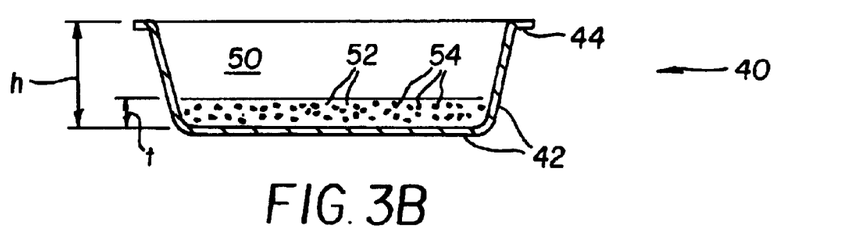
FIG. 3B depicts a sectional view of an enclosure for the test structure, the enclosure having a desiccant package formed on a portion of an interior surface of the enclosure.

Turning to FIG. 3B, there is depicted a sectional view of an enclosure 40 dimensioned to sealingly enclose at least the light-emitting portions of the OLED test structure 10. The enclosure 40 may be a metallic structure, a glass structure, a ceramic structure, or a plastic structure having a height dimension h. The enclosure can also comprise a combination of materials, such as, for example, a metallized plastic structure. The enclosure 40 has an exterior surface 42 comprising generally sloped side surfaces and a bottom surface not further identified. The enclosure 40 has a sealing flange 44 which will be used to seal the enclosure 40 against the substrate 12 of the test structure 10 to effectively enclose the test structure.

A desiccant package generally indicated at 50 has a thickness t, and is shown disposed within the enclosure 40 and extending generally along a bottom portion of the surface 42. The desiccant package 50 is comprised of a moisture-permeable binder 52 and solid water absorbing particles 54 dispersed or contained within the moisture-permeable binder 52, as will be described in greater detail hereinafter.

Figure 4:
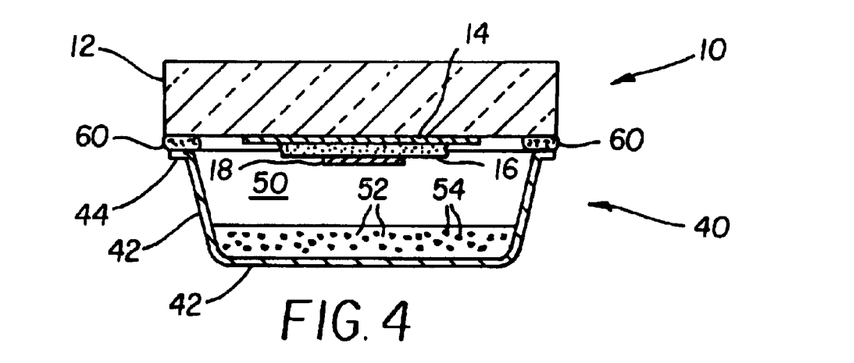
FIG. 4 shows in sectional view the OLED test structure of FIG. 3A, with the enclosure of FIG. 3B sealed to the test structure by a seal.

Turning to FIG. 4, the enclosure 40 containing the desiccant package 50 is shown in sealing relationship with the OLED test structure 10 via a seal 60 which is formed between the sealing flange 44 of the enclosure and a perimeter portion of the substrate 12 so that the OLED test structure is enclosed, and the humidity level present in the OLED test structure 10, or present in the environment surrounding the OLED test structure (i.e. the environment between the OLED test structure and an upper surface of the desiccant package 50) can be controlled by the desiccant package 50.

The desiccant package 50 comprises:
a) solid water absorbing particles 54 of one or more materials in a moisture-permeable binder 52;
b) said solid water absorbing particles 54 including solid particles of one or more materials, at least one of such materials having an average particle size range 0.001 to 0.1 micrometers to provide a high rate of water absorption and to provide an equilibrium minimum humidity level lower than a humidity level to which the OLED test structure 10 is sensitive within the sealed enclosure 40; and
c) said binder 52 being adapted to reduce degradation of or enhance the moisture absorption rate of the solid water absorbing particles 54 contained therein, the binder 52 being in solid or liquid phase or dissolved in a liquid.

Currently one or more of the materials of the solid water absorbing particles 54 is preferably selected from the group consisting of alkaline metal oxides, alkaline earth metal oxides, sulfates, metal halides, perchlorates and metals with work functions less than 4.5 eV and capable of being oxidized in the presence of moisture, or combinations thereof.

Currently the preferred the water vapor transmission rate of the moisture-permeable binder 52 is greater than 3.5 gm-mil/100 in$^2$/day. The currently preferred moisture-permeable binder 52 may be selected from the group consisting of cellulose acetates, epoxies, phenoxies, siloxanes, methacrylates, sulfones, phthalates, and amides or combinations thereof.

Currently it is preferred that the solid water absorbing particles 54 comprise 10 wt % to 90 wt % of the solid water absorbing particles 54 and the moisture-permeable binder. Currently it is preferred that the desiccant package 50 provides a humidity level less than 2500 ppm and most preferably less than 100 ppm.

A measured amount of the blend of solid water absorbing particles 54 dispersed in a moisture-permeable binder 52 is then cast on a portion of the lower interior surface of the enclosure 40, for example, by dispensing a measured amount of the blend from an automated dispensing nozzle until the dispensed blend has spread along the lower surface of the enclosure to form a desiccant package 50. The desiccant package 50 is then cured to a solid, for example, by heating the desiccant package 50 under controlled conditions so as to remove residual solvents, until the cured desiccant package 50 has the desired desiccant package thickness t.

Alternatively, if the binder is chosen to be radiation-curable or to be radiation-polymerizable, the curing step of the desiccant package 50 may include heating the desiccant package 50 while exposing the desiccant package 50 to curing radiation. Upon completion of the radiation-curing step to cure the desiccant package 50 to a solid, the enclosure 40 containing the cured desiccant package 50 is sealed against the test structure 10 as described previously with reference to FIG. 4.

Figure 5A:
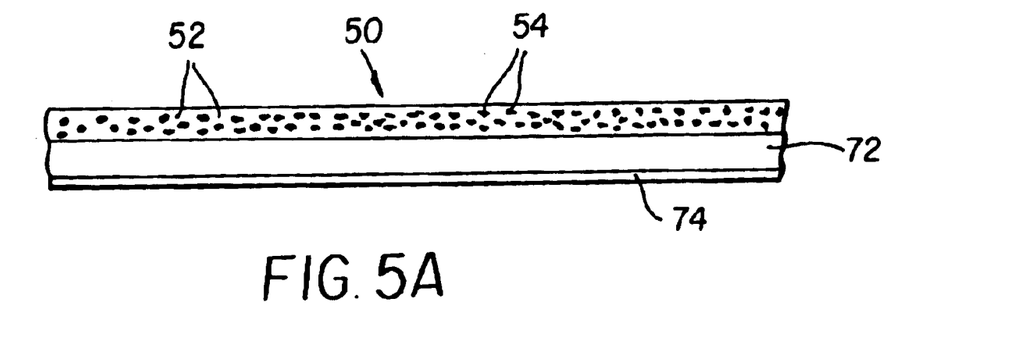
FIG. 5A depicts a desiccant package comprised of solid water absorbing particles in a moisture-permeable binder formed over one surface of a support.

Turning to FIG. 5A, there is depicted a desiccant package 50 comprised of solid water absorbing particles 54 said solid water absorbing particles 54 including solid particles of one or more materials, at least one of such materials having an average particle size range 0.001 to 0.1 micrometers in a moisture-permeable binder 52 formed over one surface of a support 72 having on an opposing surface an adhesively bondable surface 74. The adhesively bondable surface 74 in practice is covered with a peelable protective layer (not shown). The desiccant package 50 can be prepared and cured in a so-called in-line coating and curing facility to provide an extensive supply of a desiccant package 50 having a uniform layer thickness achievable by automated coating processes.

Figure 5B:
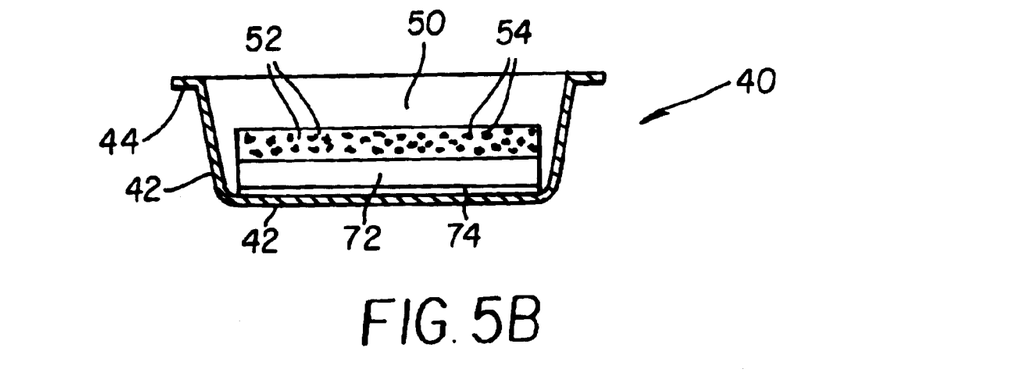
FIG. 5B shows an enclosure having a piece of the desiccant package of FIG. 5A adhesively bonded to a portion of an interior surface of the enclosure.

Turning to FIG. 5B, there is shown an enclosure 40 having a piece of the desiccant package 50 of FIG. 5A cut to an appropriate dimension and adhesively bonded to the lower portion of the interior surface of the enclosure.

Figure 6A:
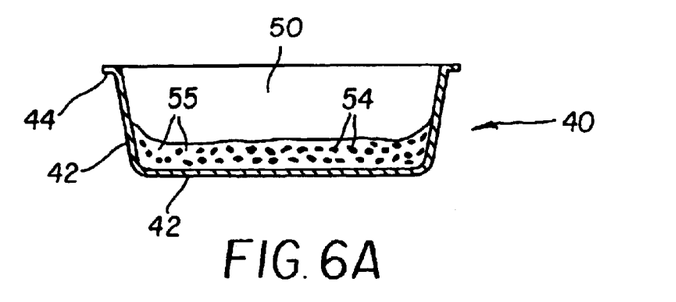
FIG. 6A shows an enclosure having a desiccant package comprised of solid water absorbing particles and a moisture-permeable radiation-curable binder.

FIG. 6A shows an enclosure 40 having a desiccant package 50 formed along a lower interior portion of the enclosure, the desiccant package 50 comprised of selected solid water absorbing particles 54 said solid water absorbing particles 54 including solid particles of one or more materials, at least one of such materials having an average particle size range 0.001 to 0.1 micrometers dispersed in a radiation-curable binder 55. The binder 55 is selected to be moisture-permeable. Preferred moisture-permeable radiation-curable binders are radiation-curable photoresist compositions, or radiation-curable acrylates, methacrylates, cyclized polyisoprenes, polyvinyl cinnamates, epoxies, silicones, and adhesives or combinations thereof.

Figure 6B:
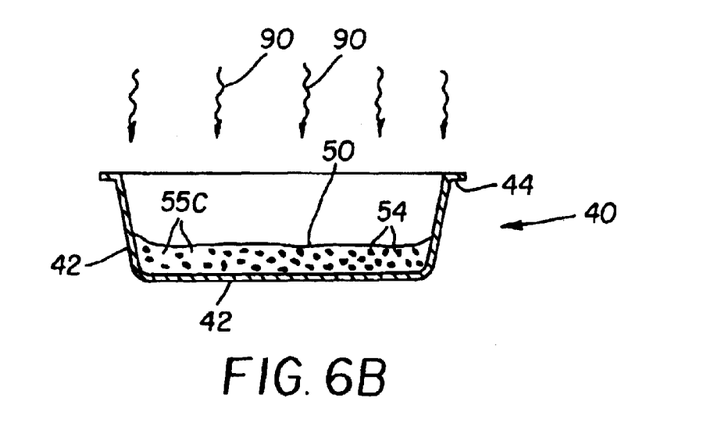
FIG. 6B indicates schematically curing radiation directed at the desiccant package to cure the moisture-permeable radiation-curable binder.

In FIG. 6B curing radiation 90 is shown directed to be incident on the desiccant package 50 to provide for the curing or polymerization of the radiation-curable binder 55 in FIG. 6A, now designated as a radiation-cured binder 55c in FIG. 6B.

It will be appreciated that the desiccant package 50 having the radiation-curable binder 55 can be formed as part of a desiccant package 50 as described with reference to FIG. 5A.

With the exception of choosing an organic radiation-curable binder, and with the exception of curing the binder by exposure to curing radiation, the preparation of a castable blend, and casting the blend to form a desiccant package 50, are process steps substantially identical to the preparation steps described with reference to the description of FIG. 3B and FIG. 4, including the step of sealing the OLED test structure 10 with the enclosure 40 by the seal 60 (see FIG. 4).

As a general rule of practice in preparing a castable blend comprised of at least solid water absorbing particles dispersed in a moisture-permeable binder, care is taken to avoid the introduction of bubbles or other discontinuities in the blend. For example, it is well known that manufacturers of paints introduce into the paint blend various so-called leveling agents, surfactants, antifoam agents, and other addenda in order to provide a stable dispersion of paint pigment at a high paint pigment loading factor in a relatively viscous binder such as, for example, an acrylic binder. Such agents and addenda can be used advantageously in the preparation of castable blends of solid water absorbing particles in a moisture-permeable binder.

Figure 7:
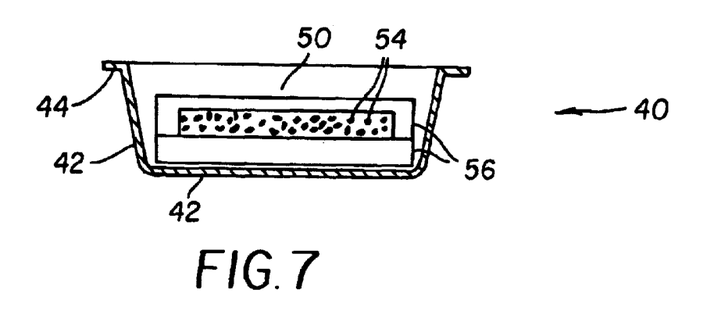
FIG. 7 shows an enclosure having a desiccant package comprised of solid water absorbing particles and a moisture-permeable container attached to an interior surface of the enclosure.

FIG. 7 shows an enclosure 40 having a desiccant package 50 formed along a lower interior portion of the enclosure, the desiccant package comprised of selected solid water absorbing particles 54 said solid water absorbing particles 54 including solid particles of one or more materials, at least one of such materials having an average particle size range 0.001 to 0.1 micrometers and a moisture-permeable container 56 attached to an interior surface of the enclosure. The moisture-permeable container 56 being adapted to reduce degradation of the moisture absorption rate of the solid water absorbing particles 54 contained therein, while separating the solid water absorbing particles 54 from the moisture sensitive device (not shown). The moisture-permeable container can be made from any materials that allow moisture permeation while still containing the solid water absorbing particles 54. Examples of materials used to form moisture-permeable containers include polymer films, woven or non-woven fabrics or tapes, perforated metal foils, and combinations thereof. In addition only a portion of the moisture-permeable container 56 is required to be permeable to moisture, such that parts of the moisture-permeable container 56 can be made of materials that are impermeable to moisture. For example one side of the moisture-permeable container 56 can be a solid metal foil or low permeability polymer film or one side of the moisture-permeable container 56 can be the enclosure 40 itself.

Currently one or more of the materials of the solid water absorbing particles 54 is preferably selected from the group consisting of alkaline metal oxides, alkaline earth metal oxides, sulfates, metal halides, perchlorates and metals with work functions less than 4.5 eV and capable of being oxidized in the presence of moisture, or combinations thereof.

Currently it is preferred that the desiccant package 50 provides a humidity level less than 2500 ppm and most preferably less than 100 ppm.

The moisture-permeable container 56 including a measured amount of the solid water absorbing particles 54 is then positioned on a portion of the lower interior surface of the enclosure 40 or the enclosure 40 is used as an integral part of the moisture-permeable container 56, for example, by bonding a moisture-permeable component along the lower surface of the enclosure with an adhesive to form a desiccant package 50.

It will be appreciated that the desiccant package 50 having the moisture-permeable container 56 can be formed as part of a desiccant package 50 as described with reference to FIG. 5A.

With the exception of choosing a moisture-permeable container process steps substantially identical to the preparation steps described with reference to the description of FIG. 3B and FIG. 4, including the step of sealing the OLED test structure 10 with the enclosure 40 by the seal 60 (see FIG. 4).

EXPERIMENTAL PROCEDURES

I. CONSTRUCTION OF THE OLED TEST STRUCTURE OF FIG. 1 AND FIG. 2

A plurality of identical OLED test structures were fabricated by the following process sequence:

(1) a glass substrate having a light-transmissive anode of indium-tin-oxide (ITO) on one surface thereof was cleaned by ultrasonicating in a commercial detergent, rinsing in deionized water, degreasing in toluene vapor, and contacting by a strong oxidizing agent;

(2) a 150 nm thick organic hole-transporting layer of 4,4'-bis-[N-(1-naphthyl)-N-phenylamino]biphenyl (NPB) was formed over the substrate and over the anode by conventional vacuum evaporation;

(3) a 375 nm thick organic emission layer of tris(8-quinolinato-N1,08)-aluminum (Alq) doped with 0.5 vol % (C545T) was formed over the NPB hole-transporting layer by conventional vacuum evaporation;

(3) a 375 nm thick organic electron-transport layer of tris(8-quinolinato-N1,08)-aluminum (Alq) was formed over the NPB hole-transporting layer by conventional vacuum evaporation;

(4) a cathode was formed over the Alq electron-transporting layer by vacuum evaporation of 0.5 nm of LiF and 100 nm of aluminum, through a shadow mask, so that the cathode was formed in a direction orthogonal to the anode, thereby defining an area of intersection between the anode and the cathode, and thus defining an area from which light would initially be emitted via electron-hole recombination at or near an interface between the Alq electron-transporting layer and the NPB hole-transporting layer.

II. PREPARATION AND SEALING OF ENCLOSURES TO OLED TEST STRUCTURES (1) each one of a plurality of suitably dimensioned enclosures (40; see, for example, FIGS. 3B, 5B, 6A, 6B) was cleaned, prior to forming a desiccant package, by a cleaning process substantially identical to the substrate cleaning process described in Section I above, except that the step of contacting by a strong oxidizing agent was deleted;

(2) a desiccant package was formed and cured along a lower interior surface of the enclosure;

(3) a sealing material was used to form a bead of sealing material along an upper surface of the sealing flange of the enclosure;

(4) the flange with the bead was positioned, and pressed against, a peripheral sealing area of the OLED's substrate, and the seal was cured by either cooling of a hot melt adhesive or UV exposure for 2 minutes of UV radiation curable adhesives, thus enclosing the OLED test structure (see FIG. 4).

III. TESTING OF ENCLOSED OLED TEST STRUCTURES (1) three to five nominally identical OLED test structures, each sealed with an enclosure containing one and the same nominally identical desiccant package, were tested to provide data related to performance and variance of performance of such sets of enclosed test structures;

(2) the initial physical and electrical width dimension w of the cathode was measured as follows:

(i) the physical width dimension was determined by microscopy in a calibrated optical microscope;

(ii) the initial effective electrical width dimension was determined during test structure in operation by applying a voltage from a drive voltage source between the cathode and the anode, and adjusted such that a current density of 20 mA/cm² was achieved in the area defined by the intersection of the anode with the cathode. The width dimension of the emitted light in a direction across the cathode provided a measure of an initial effective electrical cathode width dimension which was also measured by the calibrated microscope;

(3) initial values of physical and electrical cathode width dimensions coincided within a deviation of about ±5 micrometer;

(4) each set of enclosed OLED test structures was then stored under dark conditions in an environment test chamber at 85° C. and 85% RH for at least 100 hours;

(5) the test structures were operated under conditions described in paragraph (ii) above to measure the effective electrical width dimension of the cathode(s) following storage in the environmental test chamber;

(6) depending on the efficacy of the desiccant package formed within the enclosure of the OLED test structure, an effective electrical width dimension of the cathode was reduced more or less with respect to the initial cathode width dimension. The difference between the initial electrical (and physical) width dimension and the effective electrical cathode width dimension following storage in the environmental test chamber was tabulated for each set of test structures, and was taken as a measure of effectiveness of a particular desiccant package within an enclosure.

IV. EXAMPLES

Example 1

Pure desiccant powders (particle size 1–10 μm) in a moisture-permeable container were tested to determine their relative effectiveness in preventing cathode width shrinkage in the OLED test structure. The procedure described in the application was used to prepare the test structures except that the desiccant layers were the pure powders and they were held in place by a moisture-permeable non-woven fabric membrane that was coated on one side with a pressure sensitive adhesive. The sealing material was a hot melt polyolefin that was melted at 150° C. on the 5 mm flange of the enclosure and then pressed against the substrate while it cooled. The results of testing after 500 hrs at 85° C./85%RH were:

| Desiccant Type | Cathode Width Shrinkage (μm) |
|---|---|
| Phosphorous Pentoxide | 0 |
| Calcium Oxide | 0–5 |
| Barium Oxide | 0–15 |
| Magnesium Perchlorate | 5–10 |
| Calcium Sulfate | 45–50 |
| Molecular Sieves | 50 |
| No Desiccant | 80–150 |

The results show that phosphorous pentoxide, calcium oxide, barium oxide, and magnesium perchlorate are the best performing desiccants as predicted by their very low equilibrium minimum humidity capabilities. The results also show that the non-woven fabric container allows moisture to permeate quickly to the contained desiccant since all desiccant containing devices were better than the no desiccant control.

Example 2

Calcium oxide particles with an average size of 1.17 μm were compared to calcium oxide particles with an average size of 0.07 μm. A mixture of 25 wt % calcium oxide was dispersed in a solution of 17 wt % polyethylmethacrylate (Water Vapor Transmission Rate of 28 gm-mil/100 in²/day) dissolved in ethyl acetate. The desiccant package was formed on the interior surface of the enclosure and baked at 150° C. for 2 hrs to remove the ethyl acetate. The sealing material was a UV curable epoxy on the 1.5 mm flange that was exposed to 15 J/cm² of UV energy. The results after 593 hrs at 85° C./85%RH were:

| Desiccant Type | Cathode Width Shrinkage (μm) |
|---|---|
| 1.17 μm CaO with PEMA binder | 64 |
| 0.07 μm CaO with PEMA binder | 43 |

The results show that particle sizes less than 0.1 μm of calcium oxide dispersed in polyethylmethacrylate and cast into a film outperform the film of 1.17 μm calcium oxide dispersed in polyethylmethacrylate. This demonstrates the importance of increasing the water vapor absorption rate by decreasing the particle size of low equilibrium minimum humidity desiccants to provide sufficient protection for highly moisture sensitive electronic devices.

Example 3

Figure 8:
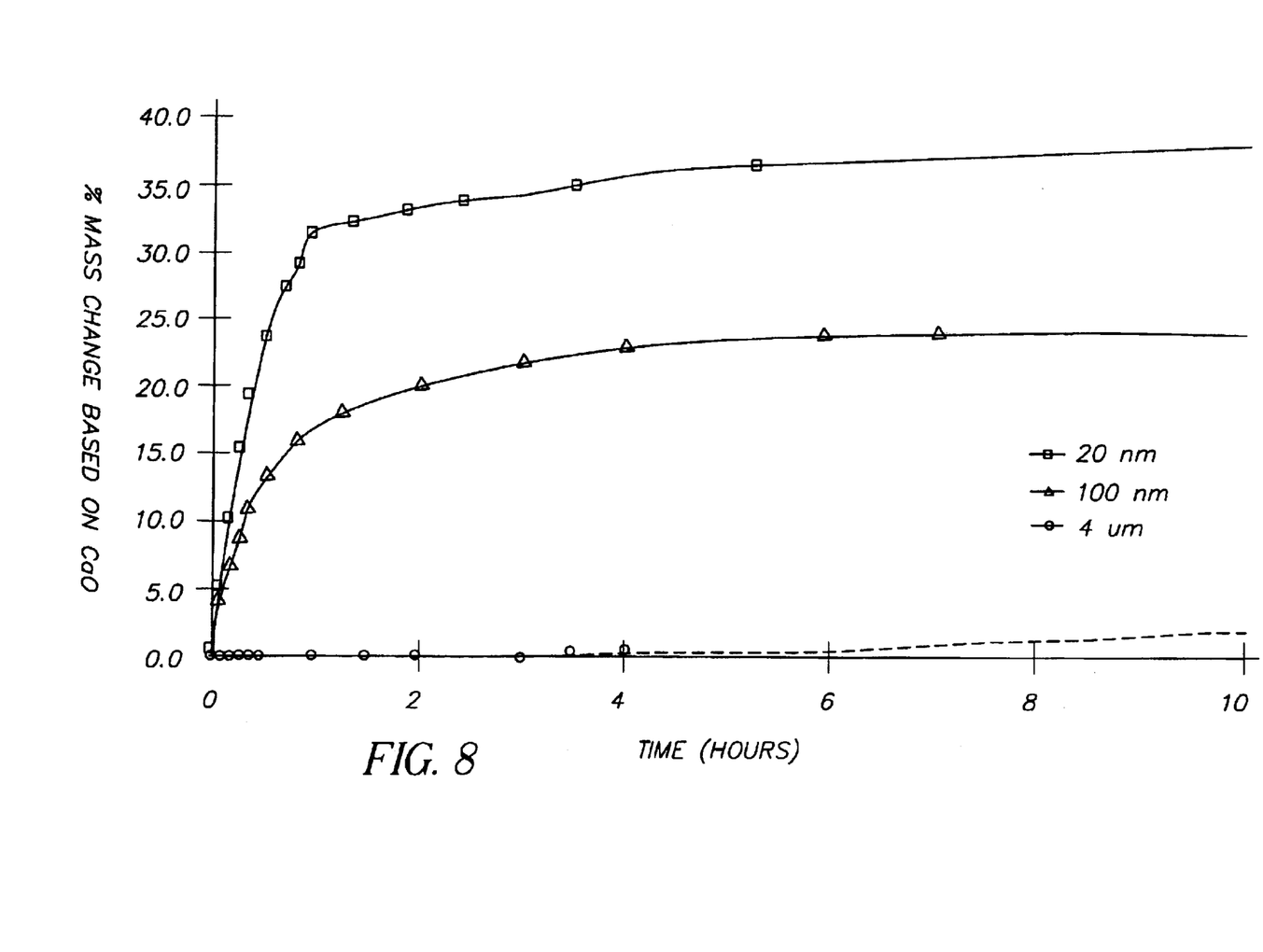
FIG. 8 is a graph which shows % mass changed based on CaO vs. time.

Calcium oxide particles with an average size of 0.02 μm, 0.1 μm, and 4 μm were compared for water absorption rate. Three mixtures of 25 wt % calcium oxide were dispersed in solutions of 17 wt % polyethylmethacrylate (Water Vapor Transmission Rate of 28 gm-mil/100in²/day) dissolved in ethyl acetate. The desiccant packages were formed on the interior surface of a pre-weighed aluminum weighing pan and baked at 150° C. for 2 hrs to remove the ethyl acetate. The samples were re-weighed to determine initial desiccant layer mass. The samples were then placed into a humidity chamber at 73° F. and 70% RH. The samples were removed periodically and weighed to determine the water absorption rate of the different desiccant packages. The results were FIG. 8. FIG. 8 depicts water absorptivity of CaO/PEMA desiccants based on particle size of calcium oxide at 73F/70% RH chamber.

The results show that the rate of water absorption is highly dependant on the size of the calcium oxide particles. The reduction of particle size from 4 μm to 0.1 μm increases the water absorption rate by over two orders of magnitude. The results also show that reduction of particle size below 0.1 μm provides additional benefits by further increasing the water absorption rate over the rate for 0.1 μm particles and by eliminating the decrease in water absorption rate as the calcium oxide approaches complete conversion to calcium oxide at 32%.

Example 4

Calcium oxide, barium oxide, calcium sulfate, and calcium bromide powders were compared to the same desiccants dispersed in phenoxy resin. 11 vol % desiccant was dispersed in a 21 wt % solution of phenoxy resin in diethyladipate. The desiccant package was formed on the interior surface of the enclosure and baked at 160° C. for 2 hrs to remove the diethyladipate. The powder was placed in the enclosure by the same method as Example 1. The sealing material and method was the same as example 2. The results after 146 hrs at 85° C./85%RH were:

| Desiccant Type | Cathode Width Shrinkage (μm) |
| --- | --- |
| Barium Oxide | 0 |
| Calcium Oxide | 26 |
| Calcium Bromide | 100 |
| Calcium Sulfate | 562 |
| Phenoxy with Barium Oxide | 11 |
| Phenoxy with Calcium Oxide | 50 |
| Phenoxy with Calcium Bromide | 133 |
| Phenoxy with Calcium Sulfate | 872 |

The results show again that calcium oxide and barium oxide are the best performing desiccants as predicted by their very low equilibrium minimum humidity capabilities. The results also show that a low water vapor transmission rate of the resin can decrease the effectiveness of all desiccants compared to the pure powders. However, the results also show that barium oxide in phenoxy still outperforms both the calcium oxide powder in the moisture-permeable container and the phenoxy with calcium oxide. This result demonstrates that the minimum resin water vapor transmission rate is dependent on the desiccant choice. This again demonstrates the importance of matching the water vapor transmission rate, the desiccant, and the water absorption rate requirements to provide sufficient protection for highly moisture sensitive electronic devices, and demonstrates the inability to predict performance of the desiccant and resin blend based solely on equilibrium minimum humidity capabilities and water vapor transmission rates.

Example 5

Blends of calcium oxide dispersed in polyethylmethacrylate (PEMA), polydiallylphthalate (PDAP), polysulfone (PSF), phenoxy and two UV curable acrylates (UV1 and UV2) were compared. 37 vol % desiccant was dispersed in 63 vol % of each resin after drying or curing of the mixture. For polyethylmethacrylate, polydiallylphthalate, polysulfone, and phenoxy mixtures the desiccant package was formed on the interior surface of the enclosure as in Example 4. For the UV curable acrylates the desiccant package was formed on the interior surface of the enclosure and cured by exposure to 15J/cm² of UV energy. The sealing material and method was the same as Example 2. The results after 146 hrs at 85° C./85%RH were:

| Desiccant Type | Resin Water Vapor Transmission Rate (gm-mil/100 in²/day) | Cathode Width Shrinkage (μm) |
| --- | --- | --- |
| UV1 with Calcium Oxide | 136 | 26 |
| PEMA with Calcium Oxide | 28 | 23 |
| UV2 with Calcium Oxide | 15 | 20 |
| PDAP with Calcium Oxide | Not measured | 43 |
| Phenoxy with Calcium Oxide | 3.5 | 50 |
| PSF with Calcium Oxide | Not measured | 62 |

The results show that a resin water vapor transmission rate of greater than 3.5 gm-mil/100 in²/day is required to prevent a decrease in the effectiveness of the calcium oxide compared to calcium oxide in resins with water vapor transmission rates of 15 to 136 gm-mil/100 in²/day. This again demonstrates the importance of matching the water vapor transmission rate, the desiccant, and the water absorption rate requirements to provide sufficient protection for highly moisture sensitive electronic devices.

Example 6

Calcium oxide powder was compared to 45 wt % calcium oxide dispersed in polyamide. The desiccant package was formed on the interior surface of the enclosure by melting the desiccant and resin mixture, dispensing the melt, and cooling to room temperature. The powder was placed in the enclosure by the same method as Example 1. The sealing material and method was the same as Example 2. The results after 146 hrs at 85° C./85%RH were:

| Desiccant Type | Cathode Width Shrinkage (μm) |
| --- | --- |
| Calcium Oxide | 24 |
| Polyamide with Calcium Oxide | 23 |

The results show that calcium oxide dispersed in a melt processable polyamide performs as well as the calcium oxide powder alone.

The present invention is particularly suitable for use with microelectronic devices which are highly moisture-sensitive. It prevents premature device failure or premature degradation of device performance. With certain microelectronic devices humidity levels should not be greater than 2500 ppm. With other devices such as organic light-emitting devices, they typically should have a humidity level no greater than 100 ppm.

The invention has been described in detail with particular reference to certain preferred embodiments thereof, but it will be understood that variations and modifications can be effected within the spirit and scope of the invention.

PARTS LIST

10 organic light-emitting device (OLED) test structure
12 light-transmissive substrate
14 light-transmissive anode
16 organic light-emitting layer
18 cathode
W physical and initial electrical width dimension of cathode 20 drive voltage supply
22 lead
23 contact to cathode
24 lead
25 contact to anode
30 emitted light
d total thickness of anode, organic light-emitting layer, and cathode
40 enclosure for OLED test structure
42 exterior surfaces of enclosure
44 sealing flange
h height dimension of enclosure
50 desiccant package
t thickness of desiccant package
52 moisture-permeable binder
54 solid water absorbing particles (dispersed in moisture-permeable binder)
55 radiation-curable binder
55c radiation-cured binder
56 moisture-permeable container
60 seal
72 support
74 adhesively bondable surface
90 curing radiation

What is claimed is:

1. A desiccant package useable for protecting highly moisture-sensitive electronic devices sealed within an enclosure, comprising:
   a) a moisture-permeable container which can be positioned in the sealed enclosure;
   b) solid water absorbing particles of one or more materials disposed in the moisture-permeable container;
   c) said solid water absorbing particles including solid particles of one or more materials, at least one of such materials having an average particle size in a range of 0.001 to less than 0.1 micrometers to provide a high rate of water absorption and to provide an equilibrium minimum humidity level lower than a humidity level to which the device is sensitive within the sealed enclosure; and
   d) said moisture-permeable container essentially maintains the moisture absorption rate of the solid water absorbing particles contained therein, the moisture-permeable container acting to separate the solid water absorbing particles from the highly moisture-sensitive device.

2. The desiccant package in accordance with claim 1 wherein one or more of the materials of the solid water absorbing particles are selected from the group consisting of alkaline metal oxides, alkaline earth metal oxides, sulfates, metal halides, perchlorates and metals with work functions less than 4.5 eV and capable of being oxidized in the presence of moisture, or combinations thereof.

3. The desiccant package in accordance with claim 1 which provides a humidity level less than 2500 ppm.

4. The desiccant package in accordance with claim 1 which provides a humidity level less than 100 ppm.

5. A desiccant package useable for protecting highly moisture-sensitive electronic devices sealed within an enclosure, comprising:
   a) solid water absorbing particles of one or more materials in a moisture-permeable binder;
   b) said solid water absorbing particles including solid particles of one or more materials, at least one of such materials having an average particle size in a range of 0.001 to less than 0.1 micrometers to provide a high rate of water absorption and to provide an equilibrium minimum humidity level lower than a humidity level to which the device is sensitive within the sealed enclosure; and
   c) said binder being adapted to essentially maintain or enhance the moisture absorption rate of the solid water absorbing particles contained therein, the binder being in solid or liquid phase or dissolved in a liquid.

6. The desiccant package in accordance with claim 5 wherein one or more of the materials of the solid water absorbing particles are selected from the group consisting of alkaline metal oxides, alkaline earth metal oxides, sulfates, metal halides, perchlorates and metals with work functions less than 4.5 eV and capable of being oxidized in the presence of moisture, or combinations thereof.

7. The desiccant package in accordance with claim 5 wherein the binder is selected from the group consisting of cellulose acetates, epoxies, phenoxies, siloxanes, methacrylates, sulfones, phthalates, and amides or combinations thereof.

8. The desiccant package in accordance with claim 5 wherein the solid water absorbing particles comprise 10 wt % to 90 wt % of the solid water absorbing particles and the binder.

9. The desiccant package in accordance with claim 5 which provides a humidity level less than 2500 ppm.

10. The desiccant package in accordance with claim 5 which provides a humidity level less than 100 ppm.

11. The desiccant package in accordance with claim 5 wherein water vapor transmission rate of the binder is greater than 3.5 gm-mil/100 in$^2$/day.

12. The desiccant package in accordance with claim 5 wherein the binder is radiation curable.

13. The desiccant package in accordance with claim 5 wherein the binder is radiation-curable photoresist compositions.

14. The desiccant package in accordance with claim 5 wherein the binder is selected from the group consisting of acrylates, methacrylates, cyclized polyisoprenes, polyvinyl cinnamates, epoxies, silicones, and adhesives or combinations thereof.

15. A desiccant useable for protecting highly moisture-sensitive electronic devices sealed within an enclosure, comprising:
   a) solid water absorbing particles of one or more materials in a moisture-permeable binder on a support;
   b) said solid water absorbing particles including solid particles of one or more materials, at least one of such materials having an average particle size in a range of 0.001 to less than 0.1 micrometers to provide a high rate of water absorption and to provide an equilibrium minimum humidity level lower than a humidity level to which the device is sensitive within the sealed enclosure; and
   c) said binder being adapted to reduce degradation of or enhance the moisture absorption rate of the solid water absorbing particles contained therein, the binder being in solid or liquid phase or dissolved in a liquid.

16. The desiccant in accordance with claim 15 wherein one or more of the materials of the solid water absorbing particles are selected from the group consisting of alkaline metal oxides, alkaline earth metal oxides, sulfates, metal halides, perchlorates and metals with work functions less than 4.5 eV and capable of being oxidized in the presence of moisture, or combinations thereof.

17. The desiccant in accordance with claim 15 wherein the binder is selected from the group consisting of cellulose acetates, epoxies, phenoxies, siloxanes, methacrylates, sulfones, phthalates, and amides or combinations thereof.

18. The desiccant in accordance with claim 15 wherein the solid water absorbing particles comprise 10 wt % to 90 wt % of the solid water absorbing particles and the binder.

19. The desiccant in accordance with claim 15 which provides a humidity level less than 2500 ppm.

20. The desiccant in accordance with claim 15 which provides a humidity level less than 100 ppm.

21. The desiccant in accordance with claim 15 wherein water vapor transmission rate of the binder is greater than 3.5 gm-mil/100 in$^2$/day.

22. The desiccant in accordance with claim 15 wherein the binder is radiation curable.

23. The desiccant in accordance with claim 15 wherein the binder is radiation-curable photoresist compositions.

24. The desiccant in accordance with claim 15 wherein the binder is selected from the group consisting of acrylates, methacrylates, cyclized polyisoprenes, polyvinyl cinnamates, epoxies, silicones, and adhesives or combinations thereof.

25. A desiccant, comprising material including at least in part solid particles of one or more water-absorbing materials, at least one of such water-absorbing materials having an average particle size in a range of 0.001 to less than 0.1 micrometers to provide a high rate of water absorption and to provide an equilibrium minimum humidity level lower than 2500 ppm, a humidity level to which a highly moisture sensitive electronic device is sensitive within a sealed enclosure; and wherein one or more of the materials of the solid water absorbing particles are selected from the group consisting of alkaline metal oxides, alkaline earth metal oxides, sulfates, metal halides, perchlorates and metals with work functions less than 4.5 eV and capable of being oxidized in the presence of moisture, or combinations thereof.

26. The desiccant in accordance with claim 25 wherein the material includes a binder selected from the group consisting of cellulose acetates, epoxies, phenoxies, siloxanes, methacrylates, sulfones, phthalates, and amides or combinations thereof.

27. The desiccant in accordance with claim 25 which provides a humidity level less than 100 ppm.

28. The desiccant in accordance with claim 25 wherein the material includes a binder that is radiation curable.

29. The desiccant in accordance with claim 28 wherein the solid water absorbing particles comprise 10 wt % to 90 wt % of the solid water absorbing particles and the binder.

30. The desiccant in accordance with claim 25 wherein the material includes a binder selected from the group consisting of acrylates, methacrylates, cyclized polyisoprenes, polyvinyl cinnamates, epoxies, silicones, and adhesives or combinations thereof.

31. A desiccant, comprising material including at least in part solid particles of one or more water-absorbing materials, at least one of such water-absorbing materials having an average particle size in a range of 0.001 to less than 0.1 micrometers to provide a high rate of water absorption and to provide an equilibrium minimum humidity level lower than 2500 ppm, a humidity level to which a highly moisture sensitive electronic device is sensitive within a sealed enclosure; and wherein the material includes a radiation-curable photoresist composition binder adapted to reduce degradation of or enhance the moisture absorption rate of the solid water absorbing particles contained therein, the binder being in solid or liquid phase or dissolved in a liquid.

32. The desiccant in accordance with claim 31 wherein water vapor transmission rate of the binder is greater than 3.5 gm-mil/100 in/2/day.

* * * * *

UNITED STATES PATENT AND TRADEMARK OFFICE
CERTIFICATE OF CORRECTION

PATENT NO. : 6,740,145 B2
DATED : May 25, 2004
INVENTOR(S) : Michael L. Boroson et al.

It is certified that error appears in the above-identified patent and that said Letters Patent is hereby corrected as shown below:

Column 18,
Line 36, should read -- 3.5 gm-mil/100 in$^2$/day --

Signed and Sealed this

Eighth Day of February, 2005

JON W. DUDAS
*Director of the United States Patent and Trademark Office*